United States Patent [19]

Buus

[11] Patent Number: 5,579,240
[45] Date of Patent: Nov. 26, 1996

[54] METHOD AND AN APPARATUS FOR ILLUMINATING POINTS ON A MEDIUM

[75] Inventor: Niels Buus, Lystrup, Denmark

[73] Assignee: Dicon A/S, Lystrup, Denmark

[21] Appl. No.: 343,479

[22] PCT Filed: May 25, 1993

[86] PCT No.: PCT/DK93/00180

§ 371 Date: Nov. 28, 1994

§ 102(e) Date: Nov. 28, 1994

[87] PCT Pub. No.: WO93/24327

PCT Pub. Date: Dec. 9, 1993

[30] Foreign Application Priority Data

May 26, 1992 [DK] Denmark .................... 0694/94

[51] Int. Cl.$^6$ ........................................ G02B 13/24
[52] U.S. Cl. ........................................ 364/525; 355/67
[58] Field of Search .................... 364/525; 355/53, 355/67, 43; 369/112, 122, 109, 44.23, 110, 120, 44.24; 362/257; 250/200, 372; 353/122; 359/197.11, 559; 356/345, 355, 354, 21

[56] References Cited

U.S. PATENT DOCUMENTS

| | | | |
|---|---|---|---|
| 3,795,446 | 3/1974 | Houston | 355/132 |
| 3,797,907 | 3/1974 | Leith | 359/30 |
| 4,130,338 | 12/1978 | Clay et al. | 359/28 |
| 4,536,883 | 8/1985 | Chapline, Jr. | 378/36 |
| 4,664,524 | 5/1987 | Hattori et al. | |
| 4,677,285 | 6/1987 | Taniguchi | 235/488 |
| 4,701,006 | 10/1987 | Perlmutter | 359/9 |
| 4,945,551 | 7/1990 | Makabe et al. | |
| 4,947,413 | 8/1990 | Jewell et al. | 250/492.2 |
| 5,030,970 | 7/1991 | Rau et al. | |
| 5,325,176 | 6/1994 | Suda et al. | 356/355 |

*Primary Examiner*—James P. Trammell
*Attorney, Agent, or Firm*—Kane, Dalsimer, Sullivan, Kurucz, Levy, Eisele and Richard, LLP

[57] ABSTRACT

A method and apparatus for the illumination of points on a medium by illuminating a plurality of perforations that are arranged parallel to the medium with light having a center wavelength $\lambda$. The perforations have a cross-section so as to provide for each perforation a diverging bundle of rays formed by defracting the light. The medium is positioned from the perforations at substantially the transition of the diverging bundle of rays between the Fresnel region and the Fraunhofer region.

8 Claims, 4 Drawing Sheets

METHOD AND AN APPARATUS FOR ILLUMINATING POINTS ON A MEDIUM

This application is a 371 of PCT/DK93/00180 filed May 26, 1991 and published as WO93/24327 Dec. 9, 1993.

BACKGROUND OF THE INVENTION

1. Field of the Invention

The invention concerns a method and an apparatus for illuminating points on a medium, said method and said apparatus being of the type defined in the characterizing portion of claim 1, respectively. In a preferred embodiment the apparatus of the invention is used for selective illumination of points on the surface of a medium, and said apparatus may comprise a central control unit having a store in which the information on a desired illumination pattern is stored.

2. Description of the Prior Art

It is known to expose photosensitive media with light to transfer information to it. This was originally done by illuminating the medium through a partly transparent original containing the desired information. To rationalize this process techniques have subsequently been developed, where a laser beam scans the medium for exposure, while the laser beam is modulated for the medium to obtain the correct illumination in all points. The information on the illumination pattern of the medium is now contained in a central control unit and is used for modulating the laser. For a satisfactory image quality to be obtained on the medium, the mechanical system retaining the original and the light source with respect to each other during exposure must satisfy strict stability requirements. For the required accuracy to be obtained, the medium for exposure is often arranged in a device of the type usually called "Internal Laser Image Drum Plotter". Devices of this type are described i.a. in U.S. Pat. Nos. 4,852,709, 4,595,957 and 3,958,250. Devices of this type provide a satisfactory image quality, but they have a very complex mechanical structure, because the light source and the medium are to be moved very accurately with respect to each other. Consequently, devices of this type have a relatively high cost price, which puts a limit to the number of users.

SUMMARY OF THE INVENTION

The object of the invention is therefore to provide a method of the type stated in the opening paragraph for illuminating points on a medium, where the apparatus is based on simpler and fewer mechanical components.

This object is obtained as stated in the characterizing portion of claim 1 by using proximity focusing in the exposure of the medium, as stated there, i.e. the medium exposed with the light is spaced very closely from an aperture or a pinhole causing diffraction of the light. It is a relatively undescribed physical effect which is employed. When collimated light enters an aperture, the light is diffracted, forming, after the aperture, a cone of light having an aperture angle determined by the wave-length of the light and the width of the aperture. This zone in which the light diverges is usually called the Fraunhofer field or region. However, the divergence of the cone of light only begins at a certain distance from the aperture, since the bundle of rays converges beforehand. The zone in which the bundle of rays converges is called the Fresnel field or region. When the bundle of rays leaves the aperture, it has a narrowing at a certain distance from the aperture. This distance depends on the diameter 2 R of the aperture, the wavelength $\lambda$ of the light and on the thickness of the wall in which the aperture is provided. If the wall thickness is negligable, e.g. a vaporized layer on a crystal, the distance to the narrowing may be expressed by $R^2/\lambda$.

Claim 2 defines an apparatus in which proximity exposure principles according to the method defined in claim 1 are used.

On the face of it, one would believe that by diffraction the light is spread too much for the bundle of rays to be used as a well-defined beam for exposure of points on a medium, but it has surprisingly been found that such a bundle of rays in the region around its narrowing can be used for this purpose. A satisfactory depth definition can be obtained by arranging the medium for exposure in the vicinity of the narrowing of the bundle of rays, provided that the cross-sectional area of the bundle of rays at the location in question is not e.g. twice as large as its smallest cross-sectional area in the narrowing.

The above applies to the case where the incident light is collimated, and where the aperture is circular. If the incident light does not have plane wavefronts, the geometry of the Fresnel and the Fraunhofer region will be changed. It may thus occur that the bundle of rays has a central zone caused by the Fraunhofer effect as well as two surrounding zones caused by the Fresnel effect. These zones are located along the axis of symmetry of the cone of light. If the aperture is not circular, but e.g. slot-shaped, the cone of light does not have a narrowing proper, but has two different locations where it has its smallest transverse dimensions in a first transverse direction and a second direction transversely to the first direction, respectively.

In case of light in the visible region the wavelength, e.g. for an Argon laser, will be about 488 nm. An aperture diameter of 5–10 µm for circular apertures will give a distance between the wall in which the aperture is provided and the narrowing of the cone of light of the order of 50–200 µm. The dot size in the narrowing of the bundle of rays will preferably be of the same order as the aperture, and in this case about 10 µm or less. Frequently, intensity-powerful and broad-banded sources of light are selected owing to the need for high light intensity and special spectral regions (in the exposure of UV-sensitive media).

It will be a great advantage if an imaging optical instrument might be omitted between the aperture or the pinhole and the medium. It will be considerably less expensive to position a rod-shaped chip having an array with the aperture transversely to the medium for exposure.

In a preferred embodiment of the invention, the invention also concerns an apparatus for selective illumination of points on the surface of a medium and comprises a central control unit in which the information on the illumination pattern on the medium is stored. The apparatus has a channel-forming unit forming a plurality of illumination channels through which a point on the medium is illuminated, as well as a light source providing the illumination channels with collimated optical energy. For each channel, the channel forming unit comprises an optical lens element to amplify the optical energy received from the light source, as well as a selectively controlled optical valve allowing or preventing optical energy from propagating through the channel. Each illumination channel has an outlet aperture which defines the size of the point formed by the channel. The central control unit is electrically connected to each of the selectively controlled optical valves for selective control of the optical energy transmitted by each individual illumination channel.

The channel-forming unit may be integrated in a chip, using micromechanical principles for modulating the optical energy in the system. It will preferably be a parallel multichannel system. Optical energy is coupled to the inlet side on the channel-forming unit. The apparatus may comprise one or more units which in combination provide a large number of channels transversely to the medium. These channels are positioned in parallel with each other. This enables linewise recording in the entire width of the medium at a time.

The channel-forming unit is preferably implemented as a chip, while the illumination channel in the channel-forming means of the unit is defined by the lens element of the channel, the size of the optical valve and the size of the channel outlet. It is usually the channel outlet which imparts the desired cross-section to the transmitted flow of optical energy. The optical valves in each of the illumination channels are controlled selectively by the central control unit of the apparatus, so that the propagation of the optical energy through the valve is permitted or prevented. The transmission properties of the valves may e.g. be changed mechanically, by applying an electric field over the valve, whereby e.g. an aluminium shutter or flap is actuated and adjusts itself to the applied voltage. The individual channels are controlled individually in a manner known per se by the central control unit, which is coupled to each of the illumination channels through a printed circuit integrated in the chip. This form of control of movable parts in a chip is mentioned in the article "Deformable-Mirror Spatial Light Modulators" by Larry J. Hornbeck in Proceedings of Spie, The International Society of Optical Engineering, Vol. 1150. The illumination channels are preferably aligned transversely to the medium for exposure. The physical size of the channel-forming means in the unit, however, is so large at present that a desired resolution cannot be obtained using a linear array alone. At present, the channel-forming means can be manufactured in chipform, so that the means are square having side lengths of e.g. 50 μm. The light dot size may be of the same order as the channel outlet, i.e. assume a largest cross-section down to about 5–10 μm. The size of the channel-forming means of the chip therefore puts a limitation to the resolution that can be obtained with the present system. However, this limitation may be eliminated by arranging several arrays in parallel, but offset with respect to each other. This offset is to be quite small. The offset is to correspond to a fraction of the length of a single means, and the fraction is to correspond to the number of arrays arranged in parallel. Thus, the offset will be quite small, and owing to the stability of the structure it is therefore expedient that the parallel arrays are implemented in one and the same chip. A delay therefore has to be incorporated in connection with transferring the information to individual arrays in response to the time it takes to move a point on the medium from a first array to the adjacent array. This distance corresponds to about 50 μm. A resolution of 2500 dpi or more can easily be obtained in this manner.

BRIEF DESCRIPTION OF THE DRAWINGS

The invention will be explained more fully below in connection with preferred embodiments and with reference to the drawing, in which.

DETAILED DESCRIPTION OF THE PREFERRED EMBODIMENT

Figure 1:
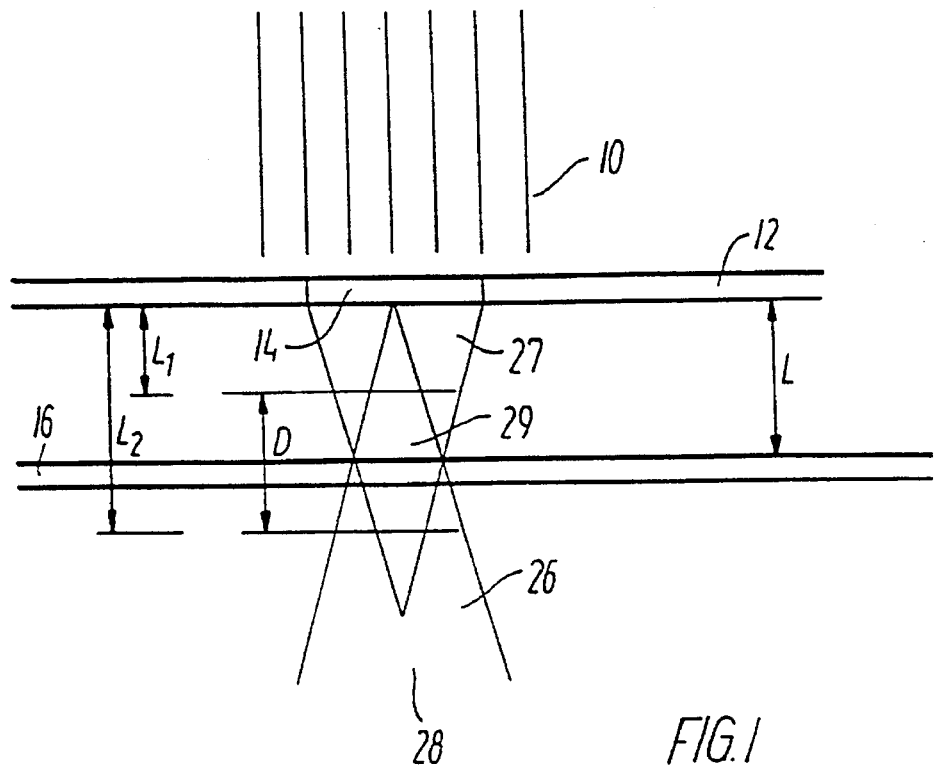
FIG. 1 shows the principles of proximity exposure.

FIG. 1 illustrates the exposure principles of the invention. A collimated bundle of rays 10 is emitted toward a wall 12 having a pinhole 14. The bundle of rays is shown as parallel rays owing to the understanding of the geometry, but in practice this will be an approximation, because it is difficult to obtain, and in some cases not even desirable to use a collimated bundle of rays. When collimated light passes a pinhole 14 or an aperture having a small cross-section, the transmitted optical energy is provided by diffraction to a considerable extent. For reasons understandable by a skilled person, the transmitted light, when the wall 12 formed with the pinhole 14 is very thin, forms a bundle of rays 28, which first converges in a Fresnel region 27 and then diverges in a Fraunhofer region 26. In the transition between these two regions 26, 27 the bundle of rays has a narrowing 29 where it has a smallest cross-section. Where the incident bundle of rays is not collimated, but has non-plane wave fronts, the bundle of rays 28 will assume more complex geometries, which will be well-known to a skilled person, and which will not be necessary in this connection for the understanding of the invention. The geometry will likewise be changed, if the pinhole 14 assumes other shapes than a circular one.

The wall 12 preferably has a thickness of the same order as the wavelength $\lambda$ of the light, or less. This can be realized if the wall 12 is provided by evaporation on a substrate. The pinhole 14 can subsequently be removed by etching. In the preferred embodiment, the shown structure is integrated in a chip.

In the shown geometry the narrowing of the bundle of rays 28 is positioned at a distance L from the wall 12, the distance L being expressed by:

$$L=R^2/\lambda,$$

where R is the radius of the pinhole 14, while $\lambda$ is the wavelength of the light. If the light source is an Argon laser, the wavelength will be $\mu$=488 nm. For a circular pinhole 14 having a radius of 8 μm the optimum exposure distance will be about 30 μm. It is usually preferred that the exposure distance L is in the range between 20 and 200 μm. The narrowing of the bundle of rays will then have a largest diameter of 6–10 μm. In case of other sources of light the physical parameters are selected in response to the wavelength. Owing to the exposure quality it will be necessary that the distance between the medium 16 and the wall 12 just varies about the optimum distance L within quite narrow tolerances.

The distance may e.g. be permitted to vary between distances $L_1$ and $L_2$, where the bundle of rays 28 has a cross-sectional area which is smaller than twice the cross-sectional area at the narrowing 29 of the bundle of rays 28. Between these distances there will be a region D in which the exposure has a form of depth definition. More remote, the cone of light or the bundle of rays diverges with an angle determined by the hole size and the wavelength. With this principle the bundle of rays can be focused on the medium 16 without using imaging optical instruments after the pinhole 14, which will be a great constructional advantage. The principle outlined above is referred to as proximity focusing or exposure below.

Figure 2:
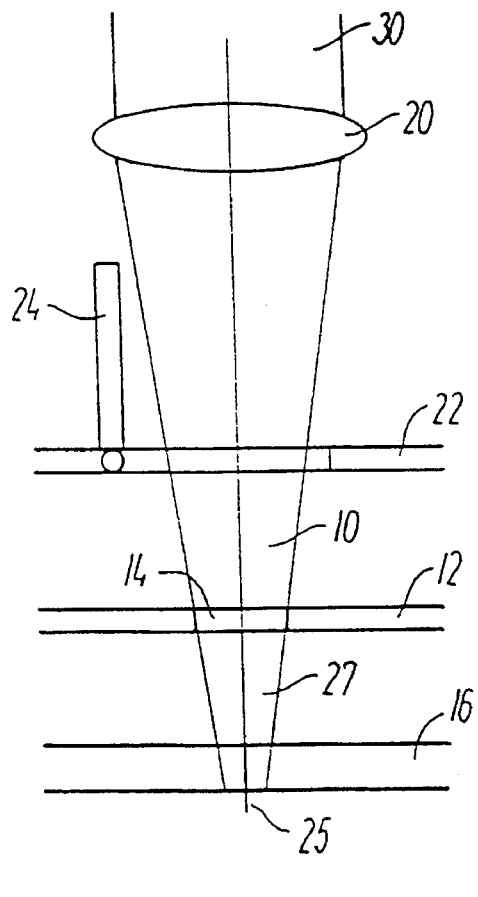
FIG. 2 schematically shows an illumination channel in the apparatus for selective illumination of points on a medium.

FIG. 2 shows an illumination channel according to the invention in which the proximity focusing technique illustrated in FIG. 1 is used. A light source (not shown) emits light 30 toward the inlet of the illumination channel in which a lens 20 is provided. The lens 20 is preferably a diffraction optical element (DOE) which has a width of the order of 50–100 μm. The lens 20 usually constitutes the limiting factor for the size of the smallest transverse dimension of a channel forming element that can be obtained. The lens 20 collects and amplifies the optical energy 30 as well as passes it on in the illumination channel in the form of the bundle of rays 10. The optical energy is transmitted from the lens 20 against a wall 22 having a valve or gate 24. The gate 24 is movable in the preferred embodiment, its movable part being coated with a metal layer so that the part adjusts itself to an electric field which is applied over the gate. Instead of containing movable parts, the gate may be stationary, and its reflection constant may be regulated by applying electric fields. The gate can hereby be either transparent or reflecting.

No matter how the function of the gate is provided, the gate 24 can be used for on/off modulating light radiation 10. As will be seen in FIG. 2, the bundle of rays 10 diverges, but, as will appear from the foregoing, this has no importance for the principle of the invention. Having passed the pinhole 14 in the wall 10, the bundle of rays hits the medium 16, as described above. The optical axis of the lens 20 is indicated by the reference numeral 25.

Figure 3:
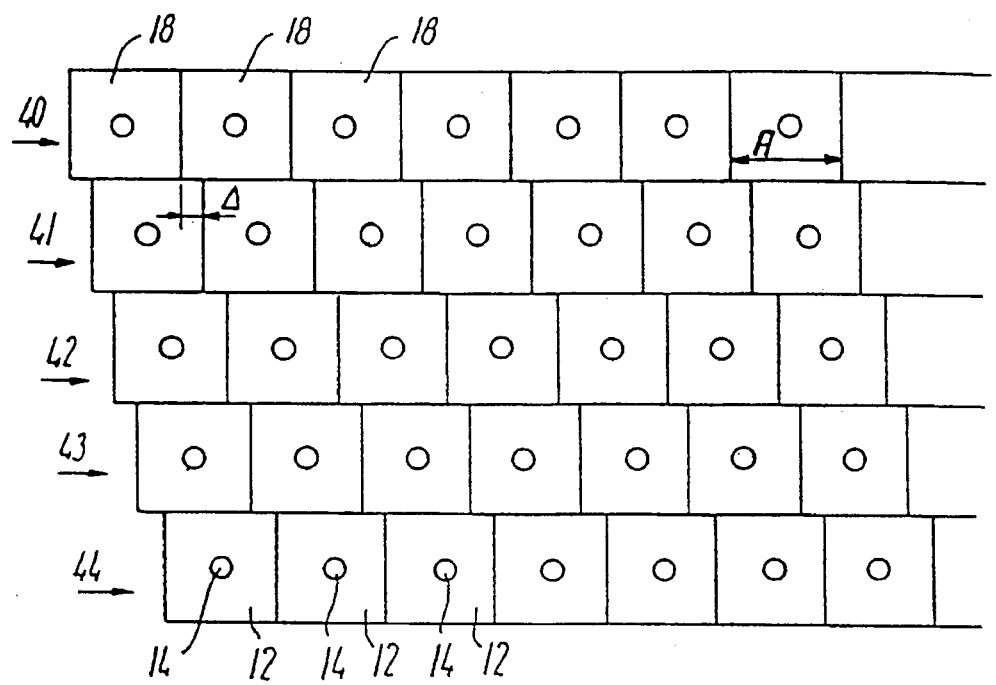
FIG. 3 shows an enlarged view of a plurality of channel outlets on a unit in an apparatus for selective illumination of points on a medium.

FIG. 3 shows a three-dimensional arrangement of channel forming units 18 according to the invention. Each of the units 18 has a wall 12 with a pinhole 14. FIG. 3 thus shows a large number of the channel forming units 18 of FIG. 2, seen from below. The units 18 are arranged in parallel rows 40–44. The units of two adjacent rows are offset at a distance Δ with respect to each other. As will be seen, the units 18 are preferably square, and they have a length A in the direction of the rows 40–44. To obtain an even distribution of the exposure points on the medium, the distance Δ, by which two units 18 in two adjacent rows are offset with respect to each other, is equal to the length A divided by the number N of parallel rows 40–44, which is 5 in this case, so that Δ=A/N=A/5. In the preferred embodiment Δ has the value 10 μm.

The rows 40–44 are implemented in a plurality of chips arranged transversely to the advancing direction of the medium, so that the rows extend perpendicularly to this direction. A line across the medium is thus exposed in that the row 40 is activated and emits modulated optical energy, while the other rows are passive. Every fifth point on the line is thus exposed. When the medium has been advanced a distance forwardly corresponding to the distance between the centers of the rows 40 and 41, the row 41 is activated so that points are exposed on the line of the medium at a distance λ from the points already exposed. At the same time, the row 40 begins to expose points on the next line. The medium 16 is thus exposed in that lines across the advancing direction of the medium are exposed pointwise by successive activation of the rows 40–44.

Figure 4:
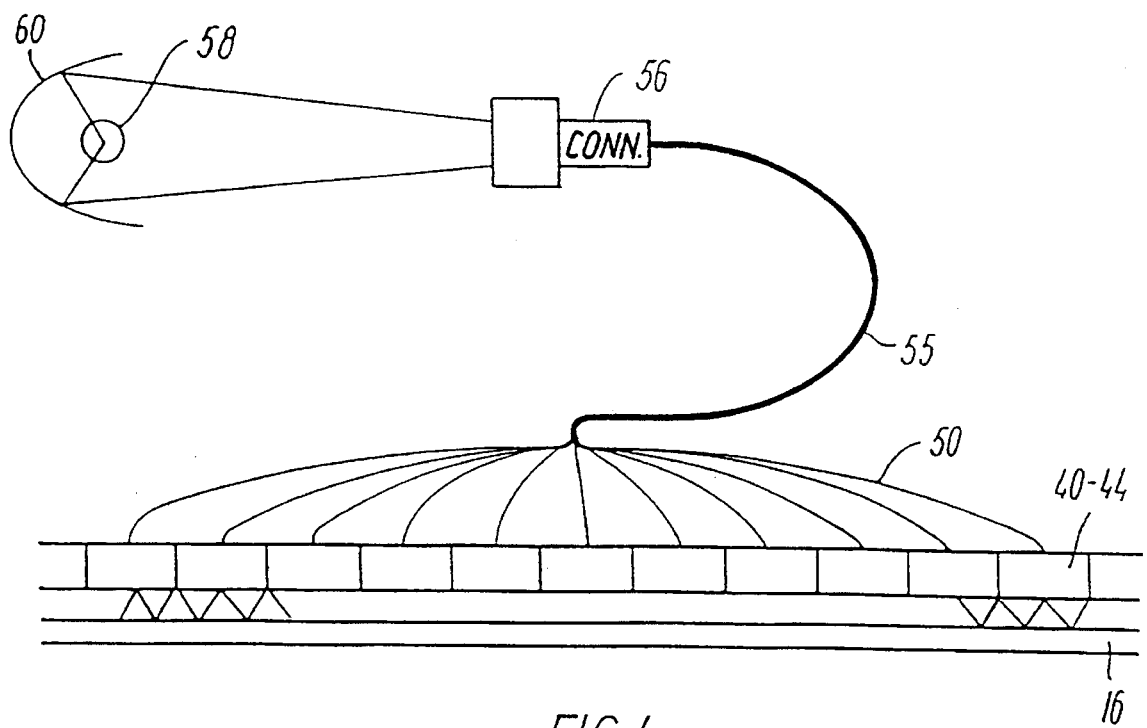
FIG. 4 schematically shows the coupling of a light source to a channel forming unit.

FIG. 4 shows an embodiment of how the illumination channels may be provided with optical energy. Optical energy from a light source 58 is coupled into a light conductor 55. Coupling takes place through a connector 56 having a suitable numerical aperture. A reflector 60 focuses the optical energy from the light source 58 on the input of the connector 56. The optical energy is transmitted from the light conductor 55 to the row 40–44 of chips via an area transforming light conductor 50, which transforms the light in the light conductor 55 to a narrow shaft of optical energy which is transmitted to the row 40–44. To obtain a suitably high level of optical energy, it is presently preferred to use a DC xenon lamp or a metal halide lamp; both of these lamps emit considerably more optical energy than a laser. Also other forms of light sources may be used depending upon the optical energy requirement. For example, it is possible to use a transversely pumped solid state laser whose cavity is formed by a glass rod. When the laser outlet is provided in the longitudinal direction of the rod, the light source and the chip row 40–44 can be arranged in quite close contact with each other.

With the light source outlined in FIG. 4, a relatively great power is needed, e.g. in the order of 1–4 kW, and the light source should therefore be positioned at a great distance from the exposure location. This, however, is no problem, since the light source 58 is coupled to the chip row 40–44 via the optical fibre or light conductor 55.

Figure 5:
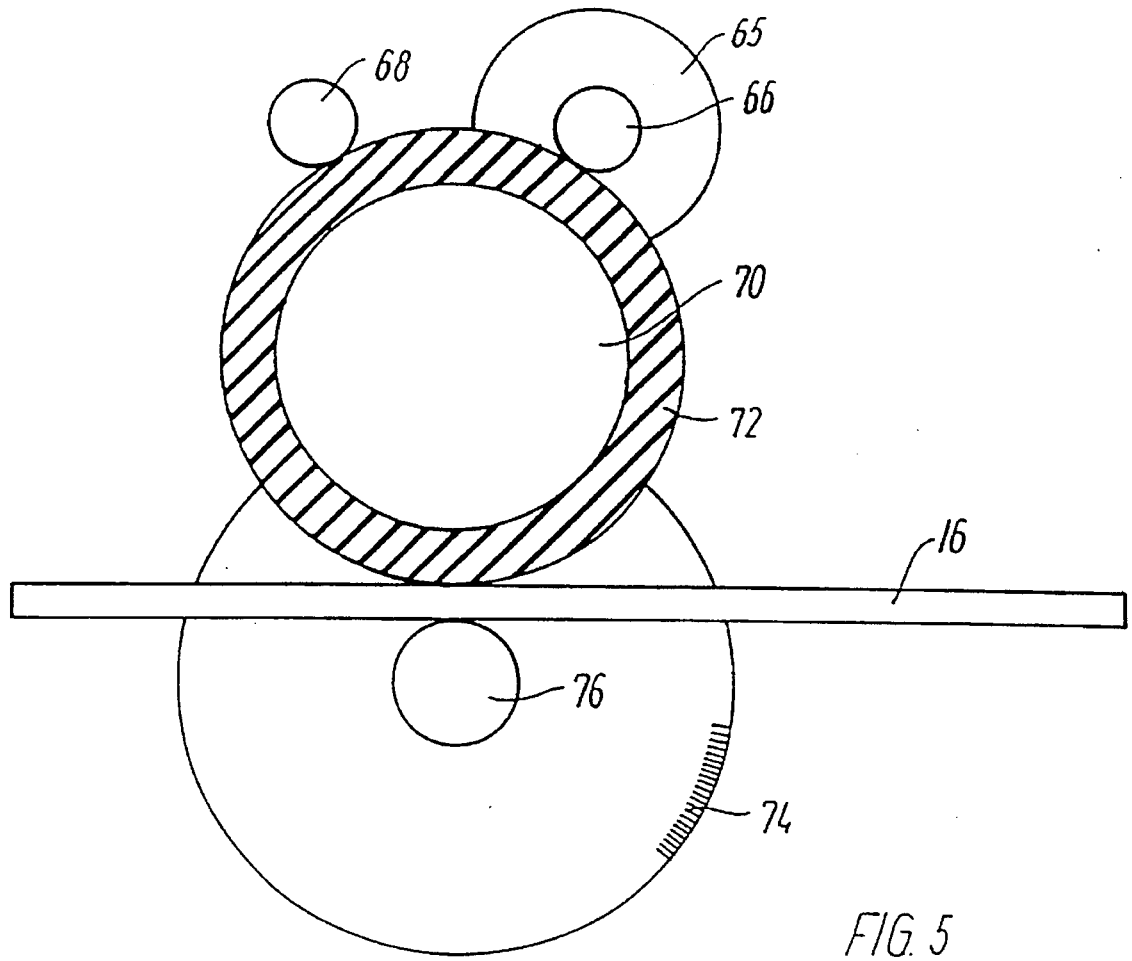
FIG. 5 schematically shows a traction system for use in a device according to the invention.

FIG. 5 shows a system for advancing the medium 16. In a preferred embodiment the medium 16 is moved past the exposure system by a transversal movement. This may e.g. be done by means of a traditional flat bed system. For economic reasons a sheet feed system is preferably used. The use of the latter system demands that the medium possesses some stiffness. This stiffness will be present when the system of the invention is used for recording standard offset plates, since these will often be of aluminium with an applied photosensitive emulsion. Other media include e.g. laser plates, film and photosensitive paper. However, the exposure system will also be useful in other connections than for exposure of printing blocks and the like, it being possible to use the exposure system described in connection with FIGS. 1–4 e.g. in the manufacture of wafers for integrated circuits.

The feed system shown in FIG. 5 is of the traction type so that the position of the medium can easily be read. The feed system comprises an electric motor 65 which has a drive wheel 66. The drive wheel 66, together with a rotatably mounted support wheel 68, frictionally engages a flexible friction wheel 70. The friction wheel 70 has a flexible rubber coating 72, by means of which a good mechanical contact with the medium 16 is obtained, without the feed system having to be adjusted each time a medium is replaced by another medium of a different thickness. The flexible friction wheel 70 presses the medium 16 against an idle wheel 76 on an encoder. The idle wheel 76 is secured to an encoder disc 74 which is peripherally provided with a row of radial marks which provide information on the position of the medium when the encoder disc 74 is transilluminated. This is an important item of information for the control unit for the exposure of the medium. The actual positional determination is prior art and will not be described more fully. A plurality of wheels is mentioned above, but a skilled person will appreciate that these wheels may either be formed by rollers transverse to the medium or by several juxtaposed wheels.

Figure 6:
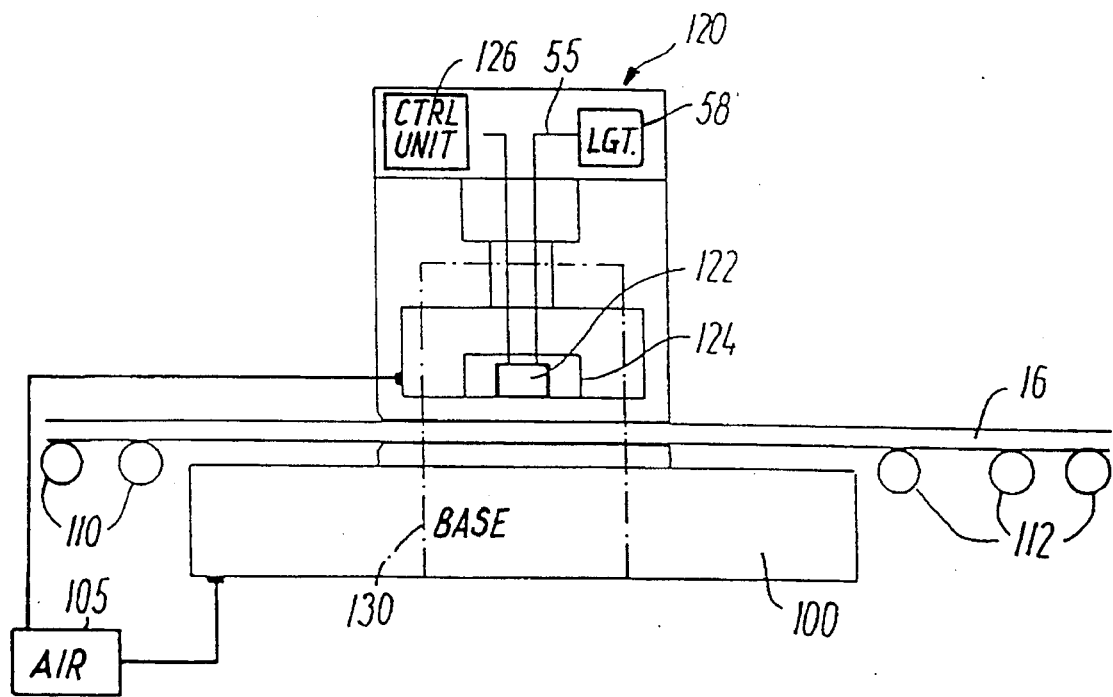
FIG. 6 schematically shows the traction system of FIG. 5 together with the apparatus for selective illumination of points on a medium.

FIG. 6 schematically shows a preferred embodiment of an image recorder according to the invention. The recorder comprises two main parts—viz. a base part 100 and an exposure part 120. The base part 100 as well as the exposure part 120 are connected to a source 105 of compressed air. The exposure part 120 is arranged so as to be displaceable in a vertical direction above the base part 100. The exposure part 120 has a rod 124 transverse to the feed direction of the medium. A plurality of micromechanical chips of the type shown in FIG. 2 are arranged in the rod 124. The chips receive light from the light source 58 via a light conductor 55. A control unit 126 or a controller contains information on the illumination pattern with which the medium is to be exposed, and the control chips in response to this. The encoder system or traction system 140 is of the type shown in FIG. 5. The traction system 130 is arranged in connection with the chip rod 124 to obtain the best possible positional determination. The medium 16 is moved by means of a conveyor 110 into the gap between the base part 100 and the exposure part 120, and another conveyor 112 receives the medium 16 after the exposure. During the exposure the medium is advanced by means of the traction system.

Figure 7:
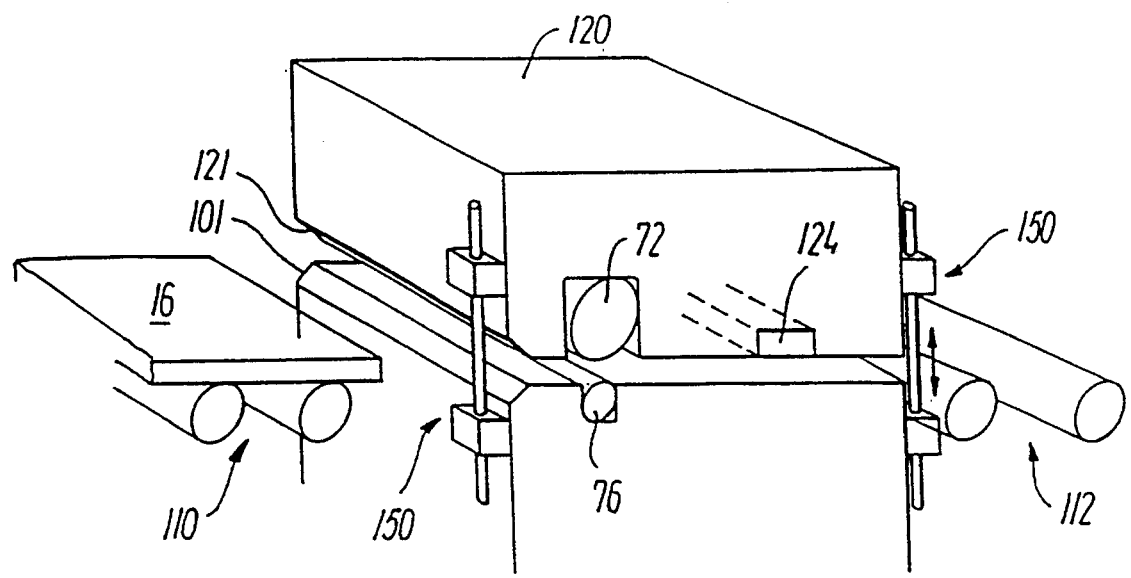
FIGS. 7–9 show selected details of the apparatus of FIG. 6.

FIG. 7 actually shows the same as FIG. 6, but it is indicated here that there is also a plurality of mechanical guides 150 permitting the base part 100 and the exposure part 120 to move with respect to each other, but only in a direction perpendicular to the medium. The distance between the bodies can hereby be regulated by means of the compressed air source 105 by regulating the added air pressure.

Figure 8:
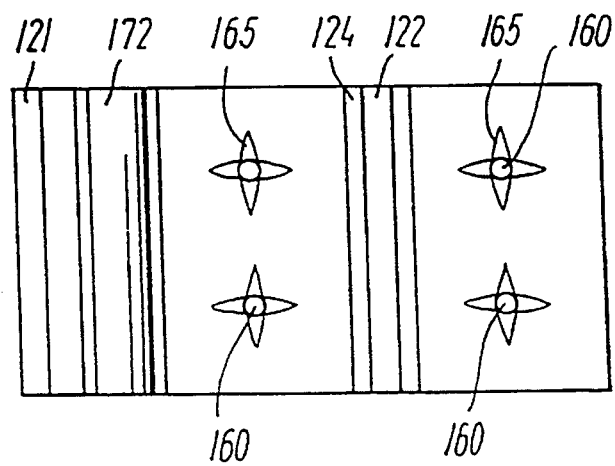

FIG. 8 shows the face of the exposure part 120 facing the medium 16, where the friction wheel 72 is visible. The exposure part 120 has an inclined front edge 121 which, together with a corresponding inclined front edge 101 on the base part 100, serves as funnel-shaped guide faces for the medium 16. The rod 124, in which a plurality of chips 122 are fixed, is seen across the exposure face of the exposure part 120. The face is moreover provided with a plurality of compressed air nozzles 160 with protruding depressions 165 in the face. The compressed air is distributed uniformly hereby, and an air cushion is provided between the face of the base part and the face of the exposure part, both of said faces being preferably provided with compressed air nozzles 160. When the medium is fed between the base part 100 and the exposure part 120, air cushions are formed on both sides of the medium 16, and it can be fed forwardly practically without friction. Further, the distance between the medium 16 and the face in which the rod 124 is arranged, is well-defined and useful in proximity exposure, the distance depending solely on the mass of the exposure part 120 and the pressure of the compressed air from the nozzles 160.

Figure 9:
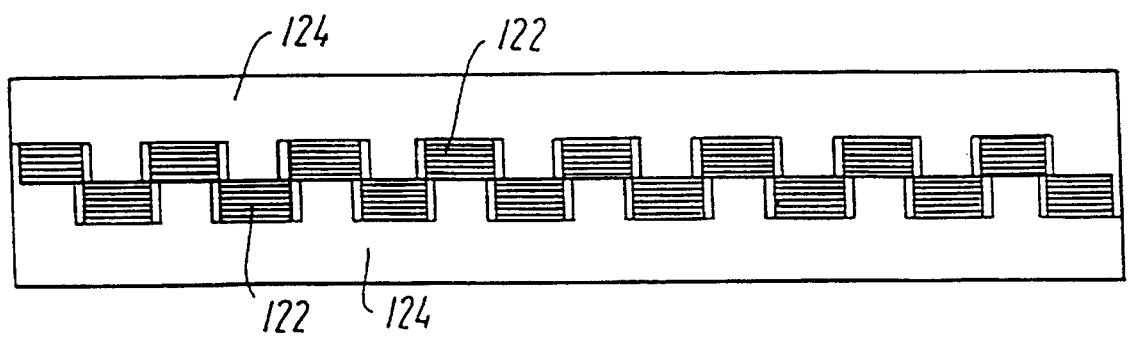

FIG. 9 shows the rod 124 with the chips 122. These are offset with respect to each other to ensure even exposure in the entire width of the rod. Each chip 122 can contain up to about 1000 illumination channels of the type shown in FIG. 2, said illumination channels being arranged in rows as shown in FIG. 3.

I claim:

1. A method for the illumination of points on a medium (16), said illumination being performed by illuminating a plurality of perforations (14) with optical energy having a center wavelength ($\lambda$), said optical energy passing through the perforations (14) and illuminating the medium (16) arranged at a distance (L) therefrom, said perforations (14) having a cross-section so as to provide, for each perforation (14), a diverging bundle of rays (28) created by diffraction, characterized by arranging the medium (16) to be illuminated at a distance (L) from the perforations (14) so that the medium (16) is substantially located in the transition of the diverging bundles of rays (28) between the Fresnel region (27) and the Fraunhofer region (26).

2. An apparatus for the illumination of points on a medium (16) and comprising perforations (14) which are arranged substantially in parallel with the medium (16) and which are illuminated with optical energy at a center wavelength ($\lambda$), said optical energy passing through the perforations (14) and illuminating the medium (16) arranged at a distance (L) therefrom, said perforations (14) having a cross-section so as to provide, for each perforation (14), a diverging bundle of rays (28) created by diffraction, characterized in that the distance (L) of the medium (16) from the perforations (14) is selected such that the medium (16) is substantially located in an area around the transition between the Fresnel region (27) and the Fraunhofer region (26) of the bundles of rays (28).

3. An apparatus according to claim 2, wherein the perforations (14) have a largest transverse dimension (2 R), characterized in that the distance (L) is within the range.

4. An apparatus according to claim 2, characterized in that the perforations (14) are evenly distributed along a substantially straight line (FIG. 3, 40–44) and have a substantially constant mutual distance (A).

5. An apparatus according to claim 4, characterized by several rows (40–44) of perforations which extend in parallel and are mutually offset with respect to each other by an offset ($\Delta$).

6. An apparatus according to claim 5, characterized in that the number (N) of rows (40–44) of perforations corresponds to the ratio of the distance (A) to the offset ($\Delta$).

7. An apparatus according to claim 2, adapted for selective illumination of points on the surface of a medium (16), and comprising a central control unit (126) storing information on a desired illumination pattern on the medium (16), wherein each perforation (14) is provided by means of an illumination channel (FIG. 2), characterized by a unit (FIG. 9; 122) having a plurality of illumination channels through which a point on the medium is illuminated, a light source (58) providing a plurality of illumination channels with optical energy,
said unit (122) for each illumination channel comprising:
an optical lens element (20) for intensifying the optical energy received from the light source (58),
a selectively controlled optical valve (24) permitting or preventing optical energy from propagating through the channel,
and an outlet aperture serving as a perforation (14) and defining the size of the point formed by the channel,
said central control unit (126) being electrically connected to each of the selectively controlled optical valves (24) for selective control of the energy transmission of each channel.

8. An apparatus according to claim 7, characterized in that the optical valve (24) is controlled by an electric field formed over the valve.

* * * * *